United States Patent
Nakajima

(10) Patent No.: US 7,560,809 B2
(45) Date of Patent: Jul. 14, 2009

(54) SEMICONDUCTOR DEVICE

(75) Inventor: Dai Nakajima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 279 days.

(21) Appl. No.: 11/549,224

(22) Filed: Oct. 13, 2006

(65) Prior Publication Data
US 2007/0187819 A1   Aug. 16, 2007

(30) Foreign Application Priority Data
Feb. 14, 2006   (JP) .............................. 2006-036104

(51) Int. Cl.
*H01L 23/50* (2006.01)
*H01L 23/528* (2006.01)
(52) U.S. Cl. .................. 257/692; 257/688; 257/784; 257/E23.079; 257/E23.153
(58) Field of Classification Search .................. 257/734, 257/784, E23.079, E23.153, 692, 688
See application file for complete search history.

(56) References Cited

U.S. PATENT DOCUMENTS

| 3,432,783 | A  | * | 3/1969  | Britton et al. ............... 335/216 |
| 6,777,258 | B1 | * | 8/2004  | Hunter ........................ 438/48  |
| 2004/0217488 | A1 |   | 11/2004 | Luechinger                            |
| 2006/0163315 | A1 | * | 7/2006  | Delsman et al. .............. 228/1.1  |
| 2007/0141755 | A1 | * | 6/2007  | Luechinger .................. 438/123  |

FOREIGN PATENT DOCUMENTS

| JP | 9-213729    | 8/1997 |
| JP | 2000-183099 | 6/2000 |

* cited by examiner

*Primary Examiner*—Victor A Mandala
(74) *Attorney, Agent, or Firm*—Oblon, Spivak, McClelland, Maier & Neustadt, P.C.

(57) ABSTRACT

The semiconductor device, including an electrode formed on the surface of a semiconductor element; and a metallic ribbon connected to the electrode. The metallic ribbon has a depressed portion on a surface contacting to the electrode, and the metallic ribbon is connected to the electrode in such a state that the metallic ribbon is deformed toward the inside of the depressed portion.

9 Claims, 8 Drawing Sheets

SEMICONDUCTOR DEVICE

CROSS-REFERENCE TO RELATED APPLICATION

The disclosure of Japanese Patent Application No. 2006-36104 filed on Feb. 14, 2006 including specification, drawings and claims is incorporated herein by reference in its entirely.

BACKGROUND OF THE INVENTION

1. Field of the Invention

The present invention relates to a semiconductor device, and more specially, a power semiconductor device using a ribbon bonding.

2. Description of the Related Art

In a power semiconductor device such as an inverter or the like, high current such as several dozen through several hundred Ampere is flown between electrodes of the device. Because of this, a ribbon having large cross-section area is used for connecting the electrodes. FIG. 7 is a side view of a conventional power semiconductor device having a ribbon bonding, generally denoted at 500. The power semiconductor device 500 includes a base board 1. An insulating substrate 2 having a metallic pattern on each side is fixed on the base board 1 with a solder layer 4. A semiconductor element 5 is fixed on the metallic pattern 3. A relay electrode 6 is also formed on the base board 1. The semiconductor element 5 is connected to the relay electrode 6 through a metallic ribbon 57 (JPA 2004-336043).

The ribbon bonding is performed by pressing the metallic ribbon 57 having an approximately rectangular cross-section onto an electrode (not shown) formed on the surface of the semiconductor element 5 with applying ultrasonic vibration. Consequently, plastic flow of the metallic ribbon 57 arises, so that the metallic ribbon 57 is connected to the electrode.

However, in the event that the above-mentioned high current is provided intermittently to the metallic ribbon 57 of the power semiconductor device 500 according to an operation of an inverter, the metallic ribbon 57 is broken away from the electrode of the semiconductor element 5, which causes failure of the semiconductor device 500. Consequently, there arises a problem that there is a limitation to the guaranteed life-time of the semiconductor 500. The coefficient of linear expansion of the semiconductor element 5 made of silicon, for instance, is approximately 2.3 ppm/degree, while the coefficient of linear expansion of the metallic ribbon 57 made of aluminum, for instance, is 23 ppm/degree which is approximately 10 times as much as that of the semiconductor element 5. Therefore, in the event that the semiconductor device 500 having heating value of several hundred W, for instance, operates, the connecting portion between the metallic ribbon 57 and the electrode is heated to the temperature of a hundred and several dozen degree, and then thermal stress is generated at the connecting portion based on the difference of the coefficients of linear expansion. It is considered that the thermal cycle fatigue is generated at the connecting portion by the difference in temperature between the temperature when current is applied and the temperature when no current is applied, which causes the separation of the metallic ribbon 57.

Correspondingly, it is suggested that the connecting strength is increased by increasing the pressure or the oscillation energy applied during the bonding step, or by increasing the amount of time for the bonding step. However, there arises a problem that the bonding machine becomes larger and more complex or a problem that the semiconductor element is destroyed during the bonding step, or the like.

As shown in FIGS. 8A and 8B, the metallic ribbon 57 is deformed to be protruded in the direction parallel to the connecting surface. FIG. 8A shows a cross sectional view of the metallic ribbon 57 used for the power semiconductor device 500, and FIG. 8B shows a cross sectional view of the metallic ribbon 57 connected to the semiconductor element 5. In FIGS. 8A and 8B, the same numerals as those of FIG. 7 denote identical or corresponding parts.

As shown in FIG. 8B, during the ribbon bonding step, the metallic ribbon 57 is deformed in the direction indicated by the arrow 9, and the protruded portion 10 is formed. As the pressure or the oscillation energy applied during the bonding step become larger, the amount of the deformation of the protruded portion 10 also becomes larger. Consequently, there arises another problem that the downsizing of the power semiconductor device 500 is difficult when the strength of the connection is increased by increasing the pressure or the like during the bonding step.

SUMMARY OF THE INVENTION

An object of the present invention is to provide a semiconductor device using ribbon bonding in which connecting strength of a metallic ribbon is increased with suppressing deformation of the metallic ribbon.

The present invention is directed to a semiconductor device, including an electrode formed on the surface of a semiconductor element; and a metallic ribbon connected to the electrode, wherein the metallic ribbon has a depressed portion on a surface contacting to the electrode, and the metallic ribbon is connected to the electrode in such a state that the metallic ribbon is deformed toward the inside of the depressed portion.

As clearly described above, according to the semiconductor device of the present invention, the connecting strength can be increased with suppressing the deformation of the metallic ribbon, thereby the downsized and highly reliable semiconductor device can be provided.

DETAILED DESCRIPTION OF THE PREFERRED EMBODIMENTS

Embodiment 1

Figure 1:
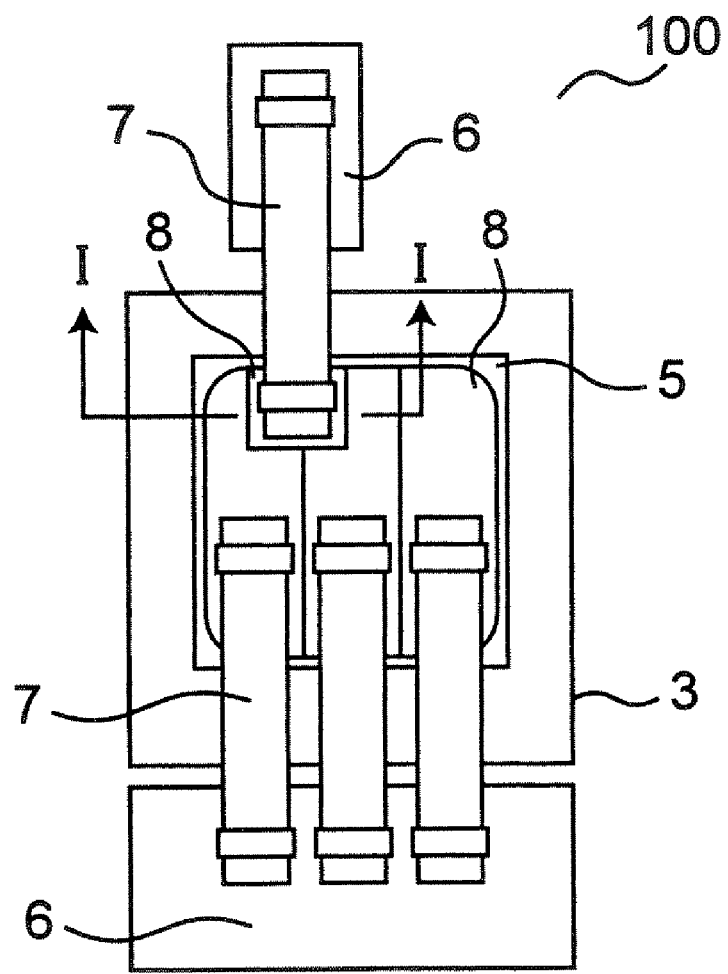
FIG. 1 shows a top plan view of the power semiconductor device according to the embodiment 1 of the present invention.
Figure 7:
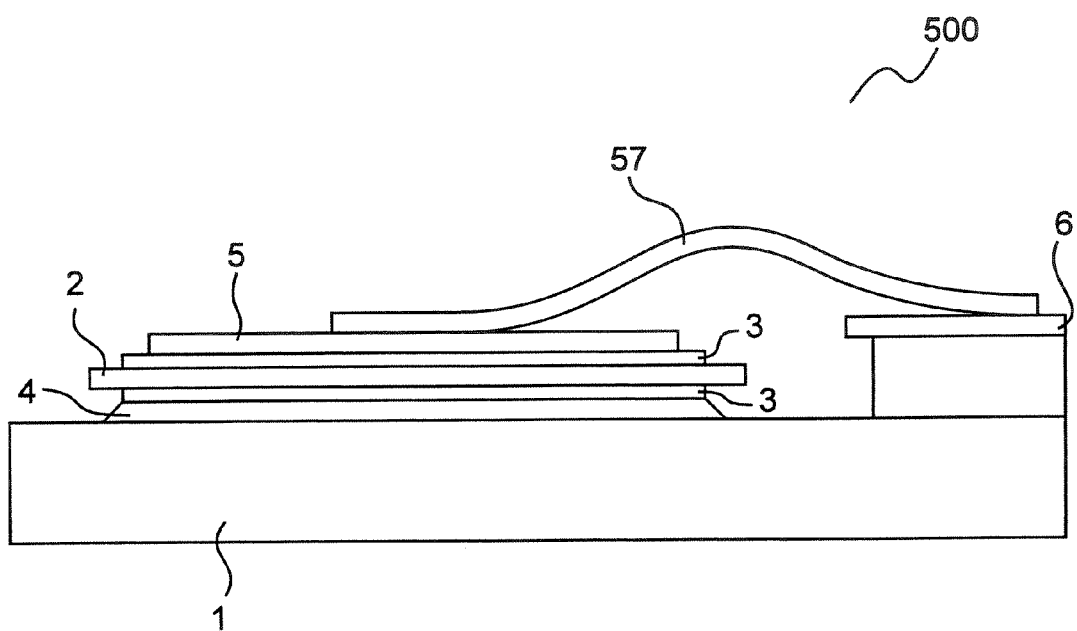
FIG. 7 shows a side view of the conventional power semiconductor device.

FIG. 1 shows a top plan view of a power semiconductor device according to an embodiment 1 of the present invention, generally denoted at 100. In FIG. 1, the same numerals as those of FIG. 7 denote identical or corresponding parts. The cross sectional view of the semiconductor device 100 has approximately the same structure as that of the semiconductor device 500 shown in FIG. 7.

The power semiconductor device 100 includes a base board of cupper, for example. An insulating substrate which has metallic patterns 3 on both surfaces respectively is fixed on the base board by using a solder layer (In FIG. 1, only the structure above the metallic pattern 3 is shown.). On the metallic pattern 3, a semiconductor element 5 such as IGBT or the like is fixed by using a solder layer, for instance. The semiconductor element 5 has an electrode 8 of metal such as gold or the like. On the base board, a relay electrode 6 is also formed. The electrode 8 of the semiconductor element 5 and the relay electrode 6 are electrically connected by using a metallic ribbon 7 of aluminum or the like.

Figure 2A:
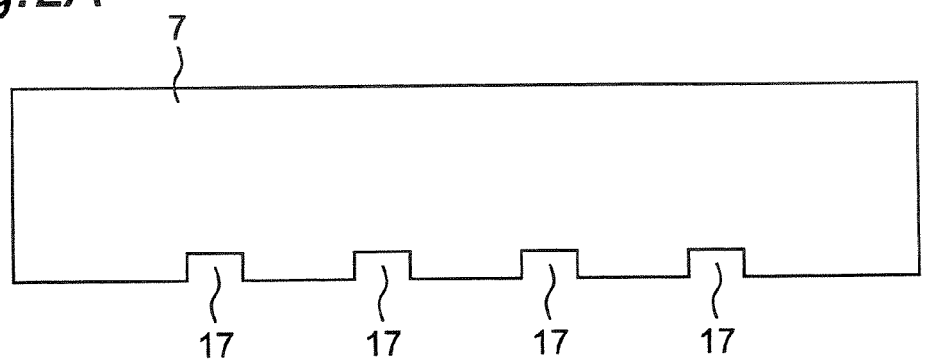
FIGS. 2A and 2B show partial cross sectional views of the power semiconductor device according to the embodiment 1 of the present invention.
Figure 2B:
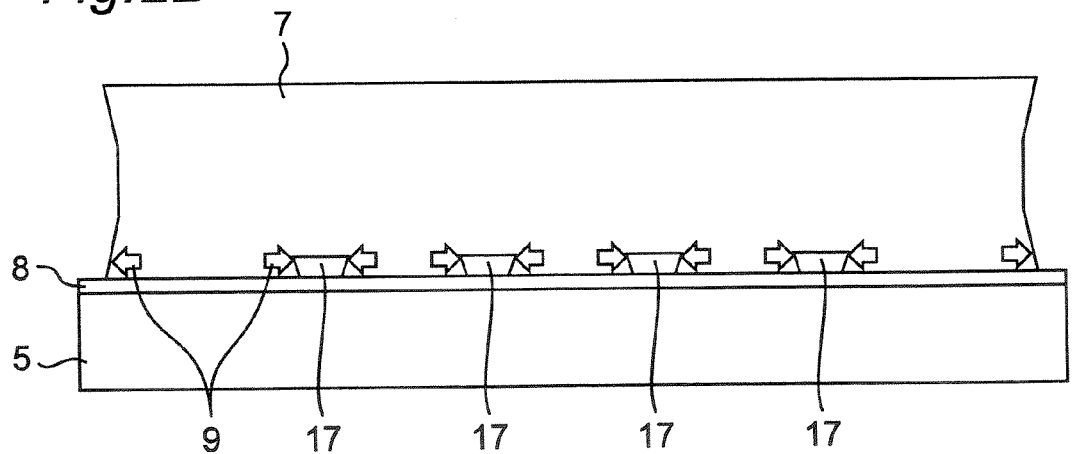

FIGS. 2A and 2B show partial cross sectional views of the power semiconductor device 100 along lines I-I in FIG. 1. FIG. 2A shows a cross sectional view of the metallic ribbon 7, and FIG. 2B shows a cross sectional view of the portion of the metallic ribbon 7 which is connected onto the electrode 8.

As shown in FIG. 2A, a plurality of grooves 17 are formed on the metallic ribbon 7 used for the power semiconductor device 100 along the longitudinal direction (in a direction perpendicular to the sheet) of the metallic ribbon 7. The cross section of the groove 17 is approximately rectangular. The groove 17 can be obtained by drawing step which uses a die with an opening identical to the cross-section of the groove 17.

When the semiconductor device 5 is rectangular or square and of which one side is within a range of 5 mm to 20 mm, for instance, the metallic ribbon 7 is preferably about 0.5 mm to 5 mm in width and several hundred μm in thickness. The depth of the groove 17 may be about 0.1 mm, for instance. It is noted that the metallic ribbon 7 may be made of tin, for instance, instead of aluminum.

In order to obtain good connection between the metallic ribbon 7 and the electrode 8 of the semiconductor element 5, it is needed that the metallic ribbon 7 and the electrode 8 are scratched each other, so that newly-formed surfaces with no oxide film or the like, which are formed on the surfaces of the metallic ribbon 7 and the electrode 8 by the scratching, should be contacted. It is considered that the main mechanism for forming the newly-formed surface is a slip of metallic atoms along a crystal surface during the plastic deformation of the metallic ribbon 7. In order to obtain a lot of slips, it is needed to increase the amount of the plastic deformation of the metallic ribbon 7.

Figure 8A:
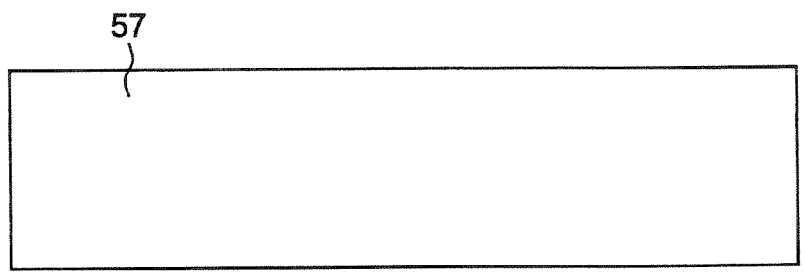
FIGS. 8A and 8B show partial cross sectional views of the conventional power semiconductor device.
Figure 8B:
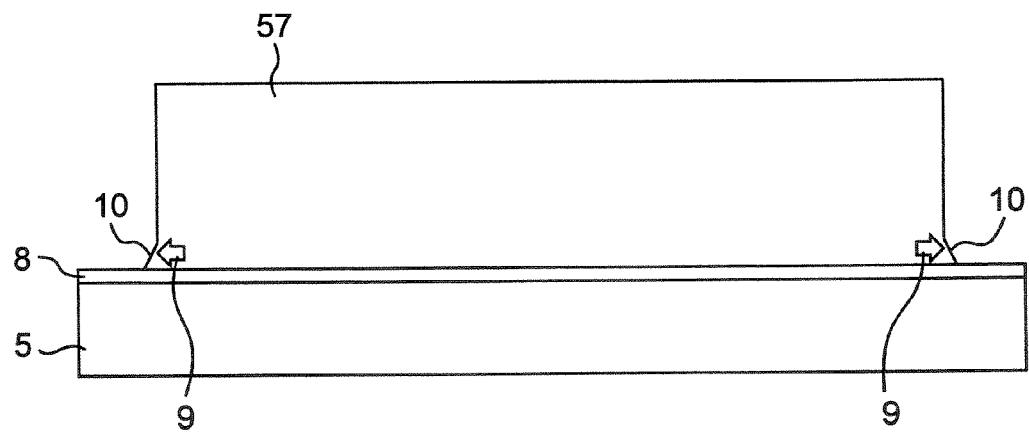

AS shown in FIG. 8B, when the conventional metallic ribbon 57 is used, the metallic ribbon 57 is significantly deformed to form the protruded portions 10 at the edges of the connected interface, and newly-formed surfaces of the metallic ribbon 57 are formed on the connected interface near the edges. However, at the center portion of the connected interface, the metallic ribbon 57 is not deformed so much because there is no space to deform, and therefore, high amount of oscillation energy or the like is needed to form a newly-formed surface at the center portion. Thus high amount of oscillation energy or the like is needed to make a good connection at the center portion of the connected interface. In this case, however, breakdown of the semiconductor element is occurred within a range of several dozen ppm to several hundred ppm.

Meanwhile in the power semiconductor device 100 according to the embodiment 1 of the present invention, the metallic ribbon 7 has grooves 17. As indicated by the arrow 9 in FIG. 2B, plastic deformation can be occurred in a direction toward the groove 17 even at the center portion of the connected interface. Consequently, a newly-formed surface can be formed by applying low amount of oscillation energy or the like, and therefore good connection can be obtained.

That is, the good connection at the interface between the metallic ribbon 7 and the electrode 8 can be obtained with preventing the breakdown of the semiconductor element 5. Consequently, the separation of the metallic ribbon 7 from the electrode 8 during the operation of the power semiconductor device 100 is prevented, so that the power semiconductor device 100 with high reliability can be supplied.

It is noted that the cross-section of the groove 17 is rectangle in this embodiment, the same effect can be obtained, however, by using a metallic ribbon with a groove of which cross-section is triangle, half circle, or the like. The cross-section of the groove can be controlled by changing shape of a die which is used for drawing step.

Embodiment 2

Figure 3A:
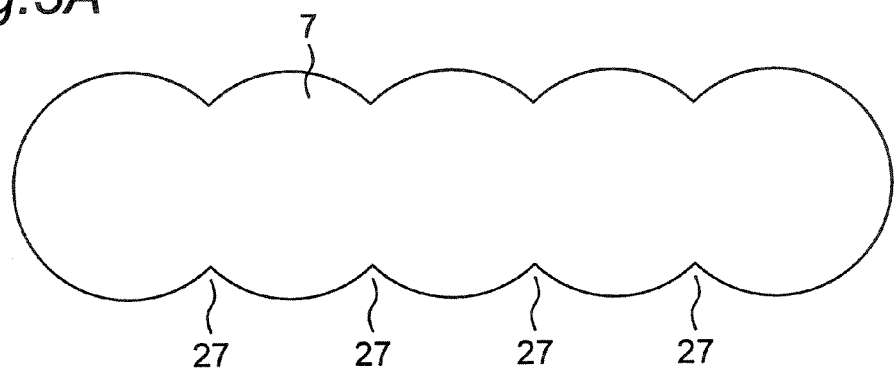
FIGS. 3A and 3B show partial cross sectional views of the power semiconductor device according to the embodiment 2 of the present invention.
Figure 3B:
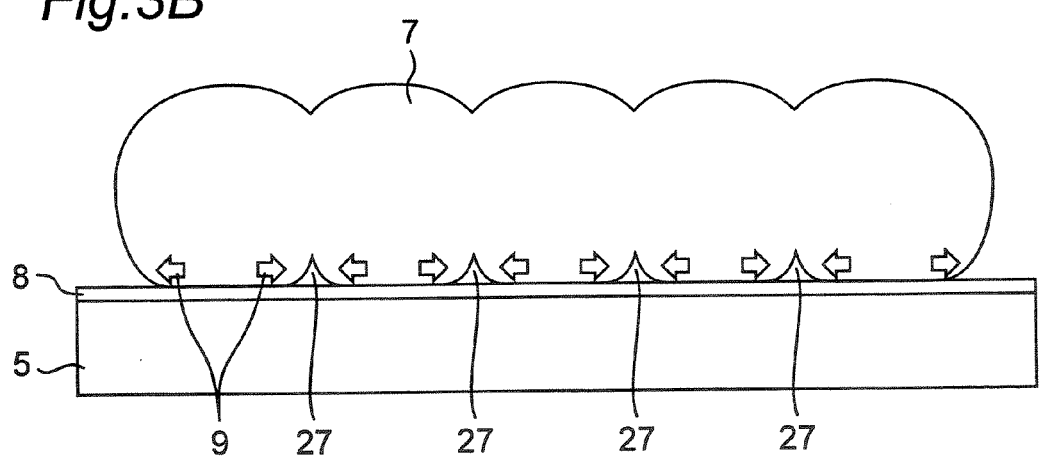

FIGS. 3A and 3B show partial cross sectional views of the power semiconductor device 100 along lines I-I in FIG. 1 including another metallic ribbon 7. FIG. 3A shows a cross sectional view of the metallic ribbon 7, and FIG. 3B shows a cross sectional view of the portion of the metallic ribbon 7 which is connected onto the electrode 8.

The metallic ribbon 7 according to the embodiment 2 of the present invention has a configuration which is made of a plurality of cylinders apposed along the longitudinal direction (in a direction perpendicular to the sheet) of the metallic ribbon 7, and partially connected.

As shown in FIG. 3A, in the cross-section of the metallic ribbon 7, a plurality of the circles are partially connected and depressed portions 27 are formed therebetween. The circle is preferably about 0.5 mm in radius, and at least two circles are connected.

The ribbon 7 having depressed portions 27 can be obtained by drawing a metal wire through a die with an opening identical to cross-section of the depressed portions 27.

When the metallic ribbon 7 according to the embodiment 2 of the invention is used, plastic deformation can be occurred in a direction toward the depressed portion 27 as indicated by the arrow 9 in FIG. 3B even at the center portion of the connected interface, which is similar to the above-mentioned embodiment 1. The metallic ribbon 7 is pressed onto the electrode 8, so that the newly-formed surface which is formed by scratching the metallic ribbon 7 onto the electrode 8 extends in lateral direction (direction indicated by arrow 9). Hereby, good connected interface is formed between the metallic ribbon 7 and the electrode 8.

Specially, by using the metallic ribbon 7 of which cross-section is made of a plurality of circles apposed each other as shown in FIG. 3A, the metallic ribbon 7 is initially in line contact with the electrode 8 at the lower top portion of the circle (point contact in cross section), so that the contact area is reduced. Even when the energy applied to the connecting portion during ribbon bonding step is significantly reduced as compared with the embodiment 1 or the conventional case, large deformation can be obtained. Hereby, the good connection at the interface between the metallic ribbon 7 and the electrode 8 can be obtained with preventing the breakdown of the semiconductor element 5, so that highly reliable semiconductor device 100 can be provided.

Embodiment 3

Figure 4A:
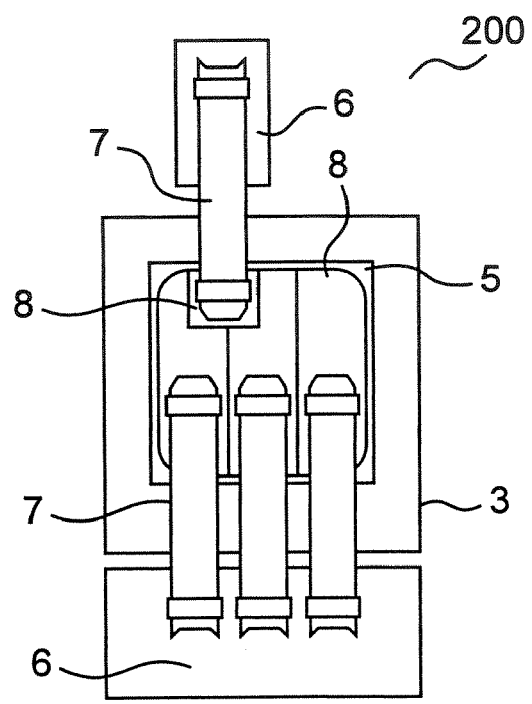
FIGS. 4A and 4B show top plan views of the power semiconductor device according to the embodiment 3 of the present invention.
Figure 4B:
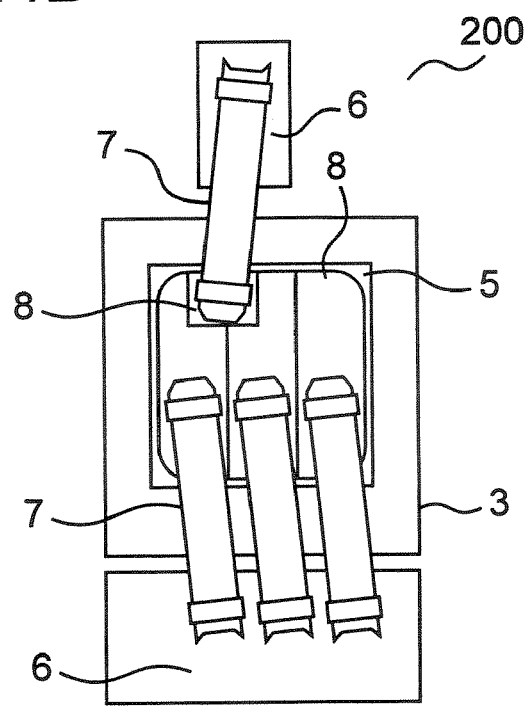

FIGS. 4A and 4B show top plan views of a power semiconductor device according to an embodiment 3 of the present invention, generally denoted at 200. In FIGS. 4A and 4B, the same numerals as those of FIG. 7 denote identical or corresponding parts. As shown in FIGS. 4A and 4B, at the end portion where the electrode 8 of the semiconductor element 5 are connected, the corner angle of the metallic ribbon 7 is obtuse (or R shape).

In the ribbon bonding step, the metallic ribbon 7 is ideally aligned along above and below direction of the drawing as shown in FIG. 4A. However the metallic ribbon 7 may actually be tilted from the above and below direction of the drawing as shown in FIG. 4B.

Figure 5A:
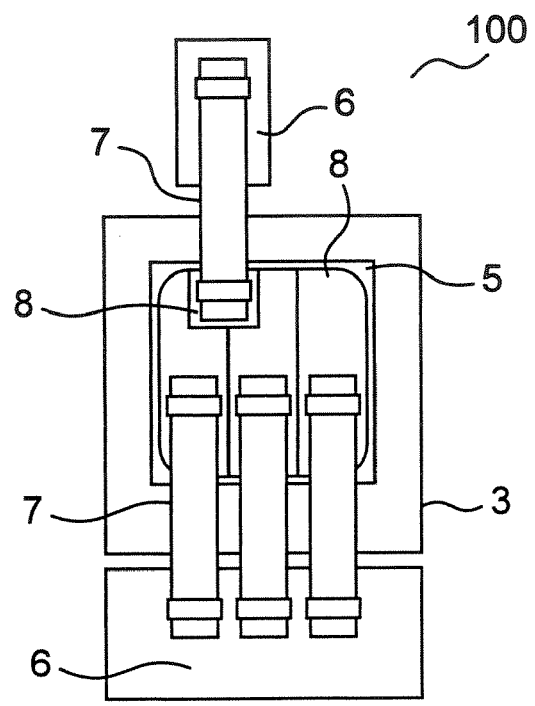
FIGS. 5A and 5B show top plan views of the power semiconductor device according to the embodiment 1 of the present invention.
Figure 5B:
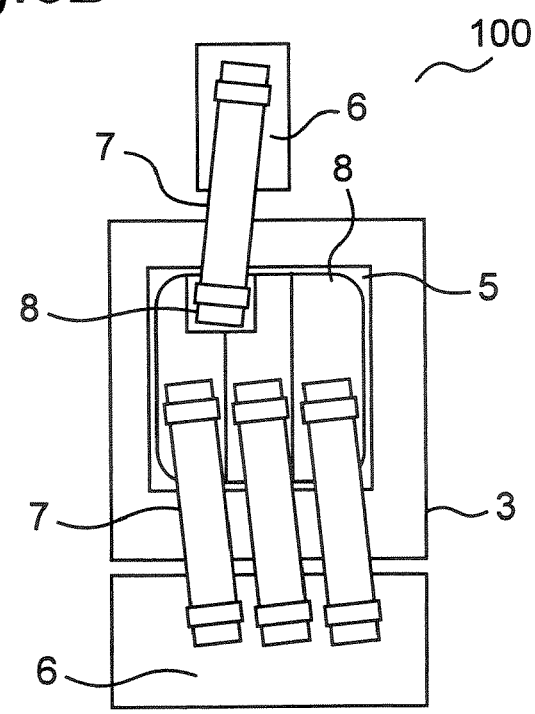
Figure 6A:
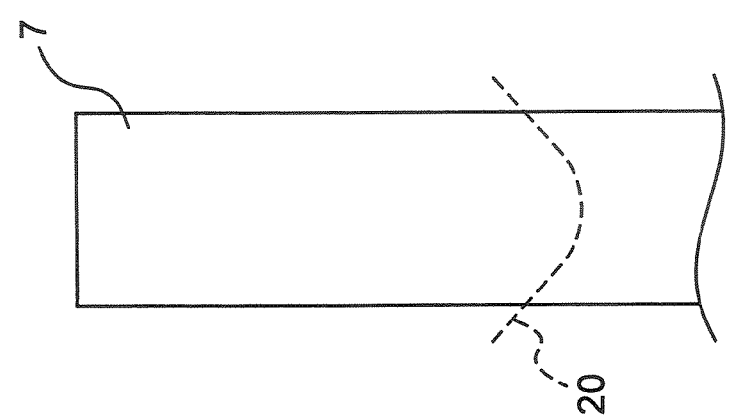
FIGS. 6A through 6D show top plan views of the metallic ribbon used for the power semiconductor device according to the embodiment 3 of the present invention.
Figure 6B:
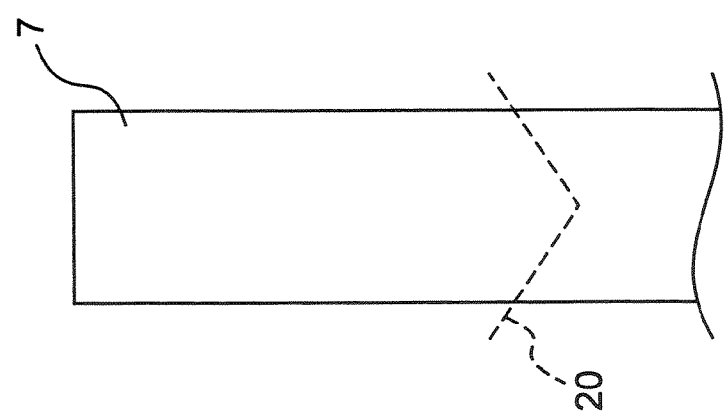
Figure 6C:
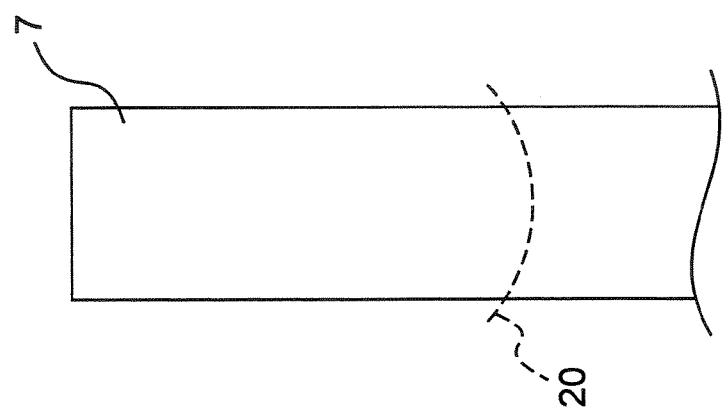
Figure 6D:
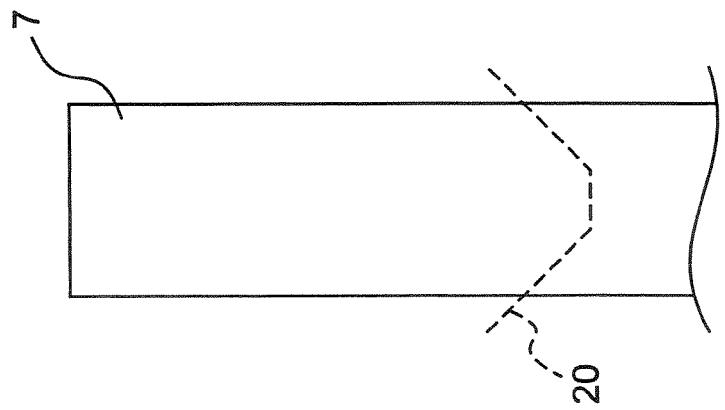

FIGS. 5A and 5B show top plan views of the power semiconductor device 100 according to the above-mentioned embodiment 1. FIG. 5A shows the metallic ribbons 7 ideally bonded, and FIG. 5B shows the metallic ribbons 7 tilted from the above and below direction. As shown in FIG. 5B, the distance between the corner of the metallic ribbon 7 and the edge of the electrode 8 becomes shorter, when the metallic ribbon 7 having right-angled corners bonded along the direction tilted the above and below direction. Consequently when the plastic deformation of the metallic ribbon 7 during the bonding step is large, the metallic ribbon 7 is connected to another electrode adjacent to the electrode to which the metallic ribbon is to be connected, thereby the semiconductor element 5 does not operate.

On the contrary, when the metallic ribbon 7 having a obtuse corners (or R-shaped corners), the distance between the corner of the metallic ribbon 7 and the edge of the electrode 8 does not become too short even when the metallic ribbon 7 is bonded along the direction tilted the above and below direction. Consequently, the metallic ribbon 7 does not contact to the other electrode even when the plastic deformation of the metallic ribbon 7 during the bonding step is large.

As described above, according to the power semiconductor device 200 of the embodiment 3, it is possible to keep enough distance between the corner of the metallic ribbon 7 and the edge of the electrode 8, even when the metallic ribbon 7 is bonded to be tilted from the above and below direction. Consequently, the energy applied during the bonding step and the deformation value of the ribbon 7 can be increased in comparison with the power semiconductor device 100 shown in FIG. 5, thereby good connection between the metallic ribbon 7 and the electrode 8 can be obtained.

That is, according to the power semiconductor device 200 of the embodiment 3, the distance between the adjacent electrodes of the semiconductor element 5 can be reduced, and the area and/or the width of the electrode can be also reduced. Consequently, the downsizing of the semiconductor element 5, particularly the downsizing of the power semiconductor device 200, can be obtained.

The metallic ribbon 7 having obtuse corners (or R-shaped corners) can be obtained by cutting a ribbon-shaped metal with a guillotine cutter, for instance. FIGS. 6A through 6D show a variety of the cutting lines 20 of the metallic ribbons 7. The cutting lines 20 shown in FIGS. 6A through 6D for instance can be used to make the metallic ribbon 7 having obtuse corners (or R-shaped corners).

It is noted that when a ribbon-shaped metal is cut in the cutting lines 20 shown in FIGS. 6A through 6D, one end of the metallic ribbon 7 has obtuse corners (or R-shaped corners), however another end of that has acute angles. As shown in FIGS. 4A and 4B, the area of the relay electrode 6 is larger than that of the electrode 8 of the semiconductor element 5, thereby no problem is caused by the metallic ribbon 7 having acute corners. The downsizing of the semiconductor element 5 is most important matter for cost reduction of the power semiconductor device 200, therefore the cost reduction of the power semiconductor device 200 can be obtained even when the area of the relay electrode 6 is rather large.

What is claimed is:

1. A semiconductor device, comprising:
    an electrode formed on the surface of a semiconductor element; and
    a metallic ribbon connected to the electrode, wherein
    the metallic ribbon has a depressed portion on a surface contacting to the electrode, and the metallic ribbon is connected to the electrode in such a state that the metallic ribbon is deformed toward the inside of the depressed portion.

2. A semiconductor device according to claim 1, wherein the cross-sectional shape of the depressed portion perpendicular to the longitudinal direction of the metallic ribbon is rectangular.

3. A semiconductor device according to claim 1, wherein the cross-sectional shape of the metallic ribbon perpendicular to the longitudinal direction of the metallic ribbon is formed of a plurality of circles partially connected to each other, so that the depressed portion is formed in the area surrounded by two adjacent circles.

4. A semiconductor device according to claim 1, wherein the depressed portion is formed as a plurality of grooves arranged in parallel to the longitudinal direction of the metallic ribbon.

5. A semiconductor device according to claim 1, wherein a center part of the metallic ribbon projects outside the contacting surface at both ends of the metallic ribbon.

6. A semiconductor device according to claim 5, wherein the both ends of the metallic ribbon have obtuse angles.

7. A semiconductor device according to claim 1, wherein a cross-sectional shape of the metallic ribbon is formed by a plurality of circles that are partially intersected with each other.

8. A semiconductor device according to claim 1, wherein the metallic ribbon is formed by a plurality of cylinders that are laterally connected to each other.

9. A semiconductor device according to claim 1, wherein a depth of a depressed portion is about 0.1 mm.

* * * * *